(12) United States Patent
Brandl

(10) Patent No.: US 7,470,503 B1
(45) Date of Patent: Dec. 30, 2008

(54) METHOD FOR REDUCING LITHOGRAPHY PATTERN DEFECTS

(75) Inventor: Stefan Brandl, Albany, NY (US)

(73) Assignee: Infineon Technologies AG, Munich (DE)

( * ) Notice: Subject to any disclaimer, the term of this patent is extended or adjusted under 35 U.S.C. 154(b) by 608 days.

(21) Appl. No.: 11/119,320

(22) Filed: Apr. 29, 2005

(51) Int. Cl.
*G03F 7/26* (2006.01)
(52) U.S. Cl. .................. 430/311; 430/329; 430/331
(58) Field of Classification Search .......... 430/311, 430/329, 331
See application file for complete search history.

(56) References Cited

U.S. PATENT DOCUMENTS

| | | | |
|---|---|---|---|
| 4,027,686 A | 6/1977 | Shortes et al. | |
| 4,741,926 A | 5/1988 | White et al. | |
| 5,070,813 A | 12/1991 | Sakai et al. | |
| 5,358,740 A | 10/1994 | Bornside et al. | |
| 5,405,813 A | 4/1995 | Rodrigues | |
| 5,555,902 A | 9/1996 | Menon | |
| 5,677,001 A | 10/1997 | Wang et al. | |
| 6,004,622 A | 12/1999 | Yen et al. | |
| 6,221,567 B1 * | 4/2001 | Beilin et al. | 430/323 |
| 6,251,487 B1 | 6/2001 | Yonaha | |
| 6,372,408 B1 * | 4/2002 | Lu et al. | 430/296 |
| 6,559,215 B2 | 5/2003 | Mills et al. | |
| 6,716,285 B1 | 4/2004 | Weyburne et al. | |
| 6,849,293 B2 | 2/2005 | Rawat | |
| 2006/0138602 A1 * | 6/2006 | Mulkens et al. | 257/635 |

FOREIGN PATENT DOCUMENTS

JP 2001-143998 5/2001

\* cited by examiner

*Primary Examiner*—Kathleen Duda
(74) *Attorney, Agent, or Firm*—Slater & Matsil, L.L.P.

(57) ABSTRACT

A preferred embodiment of the invention provides a semiconductor fabrication process. Embodiments include a method for removing contaminating particles from the surface of the wafer, such as in lithography. Embodiments also provide methods for repairing patterning defects caused by particles. The method comprises forming a resist layer over a substrate and a topcoat layer over the resist layer. The method further includes exposing the resist layer, and developing the resist layer a first time. Preferably, developing the resist layer the first time comprises dissolving a first portion of the topcoat layer in the developing solution. Embodiments further include spinning the substrate, developing the resist layer a second time after spinning the substrate. Preferably, developing the resist layer the second time comprises dissolving a second portion of the topcoat layer. Other embodiments provided include a topcoat layer that is insoluble in a developer solution, thereby requiring using a topcoat removal solution.

21 Claims, 4 Drawing Sheets

METHOD FOR REDUCING LITHOGRAPHY PATTERN DEFECTS

TECHNICAL FIELD

This invention relates generally to semiconductor manufacturing, more particularly, to a method for reducing lithography defects caused by particles on semiconductor wafers.

BACKGROUND

Particulate contamination is an important problem in semiconductor manufacturing. Particles create defects in integrated circuits thereby lowering process yields and increasing cost. Particle contamination is even more important as device dimensions become smaller. For example, a given particle size that may not have caused a defect on a 1.0 μm feature may destroy a device as that feature shrinks to 0.50 μm or below.

Many lithography processes use a top coat (TC) such as an antireflection coating (ARC) on top of a resist film. Particles deposited on the top coat create defects in the final image. Therefore, the lithography process typically includes a preliminarily cleaning of the wafer to remove unwanted particles. A variety of techniques have been proposed and implemented in the prior art in order to clean semiconductor wafers.

Some conventional cleaning methods include rinsing or spraying a cleaning solution on a wafer surface. However, as a liquid flows over the surface, there is a convection boundary layer wherein the convection velocity ranges from zero at the surface to the mainstream velocity in the bulk liquid. Because the convection velocity is almost zero near the surface, rinsing or spraying is often ineffective in dislodging particles attached to the surface or trapped in recesses. To overcome this problem, other conventional cleaning methods use ultrasonic vibrations, which more effectively clean the wafer surface. However, these methods have drawbacks as well.

Many conventional methods introduce new solvents into the lithography process. These new solvents, in turn, raise additional toxic or environmental concerns in a process already burned with such problems. Other conventional cleaning methods employ environmentally friendly solvents, such as liquid nitrogen or an argon cryogenic aerosol, but even these solvents require specialized and expensive handling equipment.

In light of problems such as these, there remains a need for improved methods for removing particulate contamination in semiconductor manufacturing.

SUMMARY OF THE INVENTION

These and other problems are generally solved or circumvented, and technical advantages are generally achieved, by preferred embodiments of the present invention that provide a method for reducing lithography defects caused by particles on semiconductor wafers.

A preferred embodiment of the invention provides a semiconductor fabrication process. The fabrication process includes a method for removing contaminating particles from the surface of a substrate, preferably before lithography. The method comprises forming a resist layer over the substrate and a topcoat layer over the resist layer. The substrate may comprise, for example, a partially fabricated integrated circuit on a semiconductor wafer device.

Embodiments further include exposing the resist layer (through the topcoat), and developing the resist layer a first time. Preferably, developing the resist layer the first time comprises dissolving a first portion of the topcoat layer in the developing solution. Embodiments further preferably include a spin off to remove contaminating particles from the substrate, and developing the resist layer a second time after the spin off. Preferably, developing the resist layer the second time comprises dissolving a second portion of the topcoat layer. The resist layer development time is preferably about 30 sec.

Other embodiments include a topcoat layer that is insoluble in a developer solution, thereby requiring using a topcoat removal solution. Still other embodiments further include dispensing a cleaning liquid onto the resist layer before exposing the resist layer, or before developing the resist layer the first time, and then spinning off the cleaning liquid.

A spin off process, such as for removing the topcoat layer, may comprise a series of steps. The series in preferred embodiments comprises rotating the substrate in a first direction at a first rotational velocity, and rotating the substrate in a second direction at a second rotational velocity. Preferably, the second direction is opposite the first direction. Embodiments may include repeating the series of steps a plurality of times. Embodiments of the invention include rotational velocities up to 3,000 rpm, or greater.

Note that although the term layer is used throughout the specification and in the claims, the resulting features formed using the layer should not be interpreted together as only a continuous or uninterrupted feature. As will be clear from reading the specification, the semiconductor layer will be separated into distinct and isolated features (e.g., active regions), some or all of which comprise portions of the semiconductor layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for cleaning a surface of a substrate such as a semiconductor wafer. Preferred embodiments of the invention provide a method of removing particles from a topcoat on a resist film by spinning the substrate. Embodiments may generally be referred to as a spin cleaning method or a spin off process.

In embodiments of the invention, the wafer is rotated, or spun, about a rotational axis at an angular velocity, which is expressed in revolutions per minute (rpm). Preferably, the rotational axis is substantially perpendicular to the surface of the wafer. This configuration and suitable equipment for performing this process are widely used for spin coating in the semiconductor arts. As the wafer is rotated, centrifugal force accelerates the liquid across the wafer surface from its centrifugal center towards the wafer edge.

Figure 1:
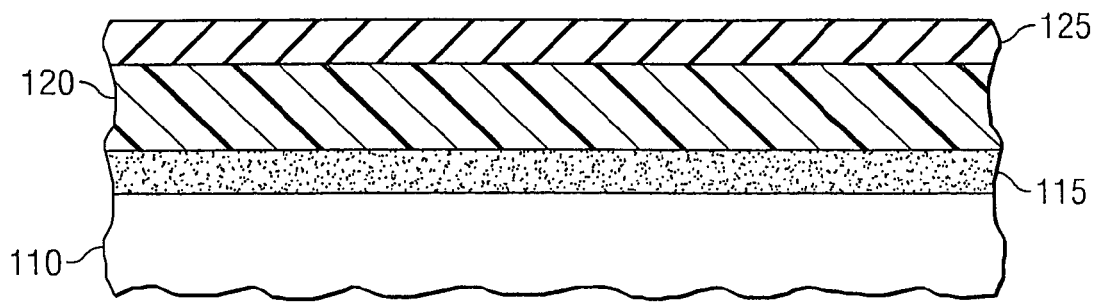
FIGS. 1-7 are side views illustrating particle removal and defect repair for a first embodiment of the invention.

Turning now to FIG. 1, there is illustrated a first preferred embodiment of the invention. For illustrative purposes, the structure in the figure is a semiconductor device or an integrated circuit at an intermediate stage in fabrication. In FIG. 1, the device comprises a substrate 110, a bottom antireflective coating (BARC) 115 over the substrate 110, a resist 120 over the BARC 115, and topcoat 125 over the resist 120. In the embodiment of FIG. 1, the resist 120 is not exposed, i.e., the device before exposure. In alternative embodiments this stacked arrangement of layers may include additional layers interposed between the aforementioned layers, or, as illustrated in FIG. 1, the layers are formed on each other substantially as shown.

Various suitable BARC layers, resists, and topcoats are commercially available. For example, BARC AR40, is sold by Rohm-Haas, Philadelphia, Pa. Resist ARX1682J-15 is sold by JSR Micro of Sunnyvale, Calif., as is topcoat TCX014. Topcoat TSP-3A and topcoat remover TSP-3A are sold by Tokyo Ohka Kogyo (TOK) Co., of Japan.

The topcoat 125 may also comprise an antireflective coating. In other embodiments, it comprises a spun-on dielectric such as a spun-on glass (SOG), pentacene, or polyimide, for example. In other embodiments, the topcoat may comprise a spun-on liquid such as, a cleaning solution, or a polymer used in the fabrication of polymer thin film transistors. In still other embodiments, the topcoat 125 may comprise a second resist layer, wherein the second resist layer is the same or different than resist 120.

Other embodiments of the invention may be used in semiconductor fabrication methods where there is no topcoat. Such a method comprises, forming a resist layer over a substrate, exposing the resist layer, developing the resist layer a first time, spinning the substrate, and developing the resist layer a second time after spinning the substrate.

In a preferred embodiment, the topcoat 125 is a protective layer in an immersion lithography process. In such an embodiment, the topcoat 125 is formed between a resist layer and an immersion liquid (typically water). Its functions include protecting the equipment from outgassed chemicals, preventing leaching of the resist, and preventing resist poisoning.

Still other embodiments further include dispensing a cleaning liquid onto the resist layer before exposing the resist layer, or before developing the resist layer the first time, and then spinning off the cleaning liquid. Suitable cleaning liquids include water or acids such as phosphorous acid and acetic acid, and combinations thereof.

The substrate 110 may be a material such as Si, SiGe, GaAs, InP, GaN, SiGe graded buffer, silicon on insulator (SOI), II-VI or III-V compound semiconductors, or combinations thereof. In other embodiments, the substrate may include another device or an intermediate device such as a capacitor, a memory array, or an interlevel wiring arrangement, for example.

Figure 2:
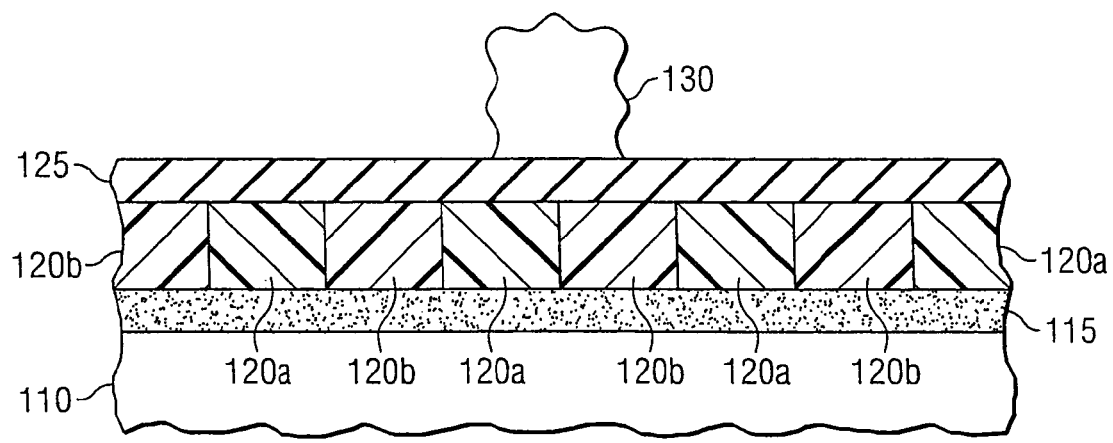

Turning now to FIG. 2, there is the device after exposing the resist 120 in FIG. 1 in a conventional lithography process, thereby forming an exposed resist 120a and a second resist portion which will comprise the patterned resist 120b after development. On the topcoat 125 is an impurity particle 130. The impurity particle 130 may include a particulate contamination such as that commonly encountered on a wafer in semiconductor processing, for example, silicon oxide or a metal-containing impurity. Only a single impurity particle 130 is shown for ease of illustration, but one skilled in the art understands that a contaminated surface typically contains a large plurality of particles, perhaps having widely ranging sizes and compositions.

For illustrating the first preferred embodiment, the impurity particle 130 contaminated the topcoat 125, after forming the exposed resist 120a. Consequently, the particle did not shade any portion of the resist 120 during exposure.

Figure 3:
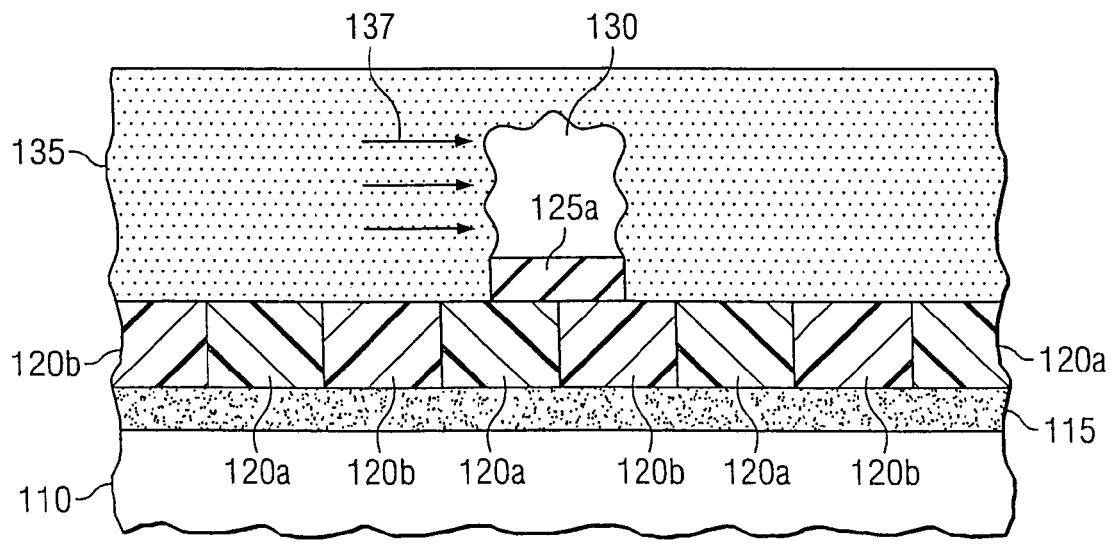

Turning now to FIG. 3, there is illustrated the intermediate device now further including a topcoat removing solution, or, more briefly, a topcoat remover 135. As illustrated in FIG. 3, the topcoat remover 135 has dissolved a first portion of the topcoat 125 so that only a second portion, a topcoat residue 125a, remains behind. The topcoat residue 125a is substantially under the impurity particle 130.

Defects caused by incomplete removal of resists, coatings, dielectrics, or other layers are commonly observed in lithography, and their adverse affect on process yield is widely recognized. Preferred embodiments of the invention provide a method of repairing a defect such as topcoat residue 125a illustrated in FIG. 3.

The topcoat remover 135 preferably comprises a polar liquid, such as water. Polar liquids are preferred because they advantageously disrupt Van der Waals or other electrostatic forces that hold the impurity particle 130 to the topcoat 125.

Preferred embodiments use centrifugal force created by spinning the substrate 110 as described above to drive particles off the substrate. In FIG. 3, the arrows 137 illustrate the centrifugal force acting on the impurity particle 130. The substrate 110 preferably comprises a semiconductor wafer having a radius up to about 10 cm or larger. In embodiments, a chemical supply source dispenses a liquid, such as a topcoat remover, onto the surface of the substrate. In other embodiments, the substrate is immersed in the liquid. The substrate is mounted on a rotatable chuck. Upon spinning the substrate, centrifugal force drives the liquid along with the contaminating particles across the surface and off the edge of the substrate. The rotation speed is a design choice, but it generally may be in the 10 to 3,000 rpm range, although higher speeds are within contemplated embodiments of the invention.

Figure 4:
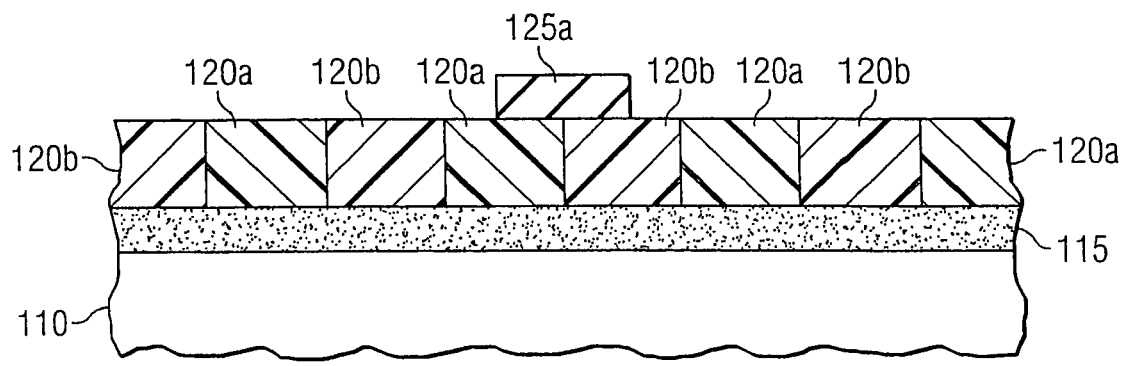
Figure 5:
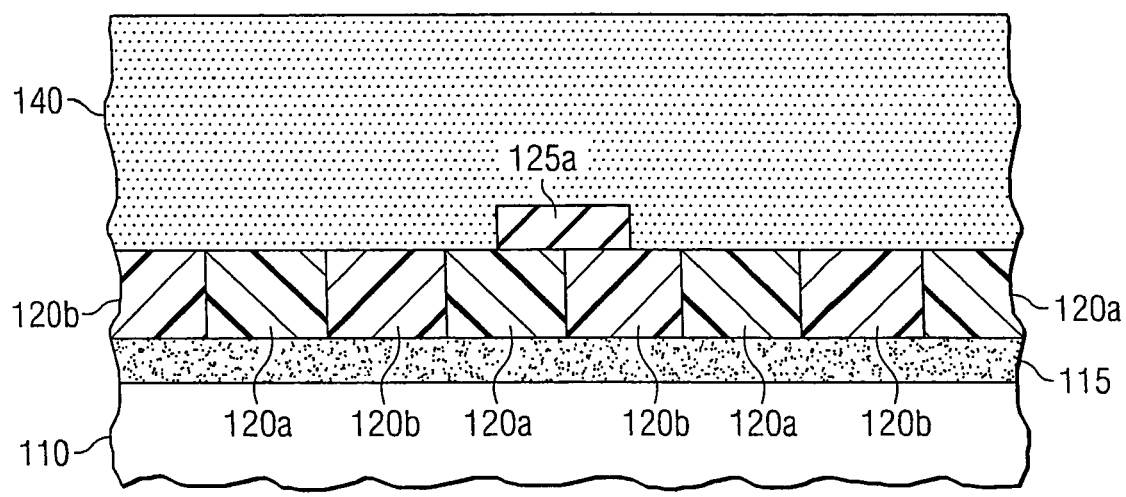
Figure 6:
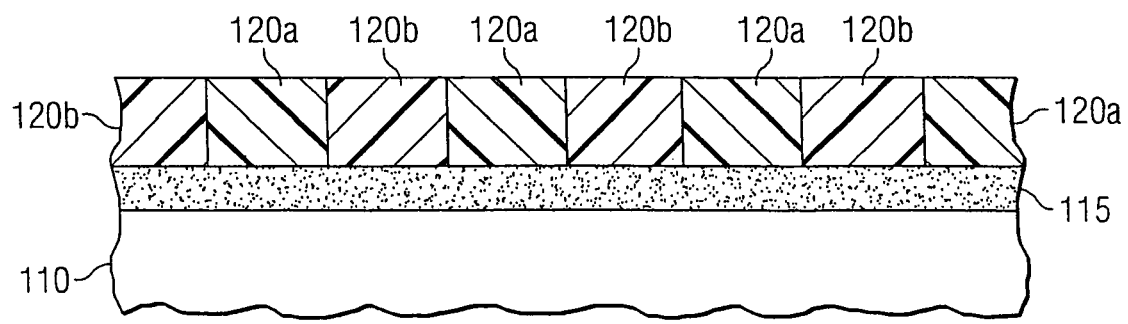
Figure 7:
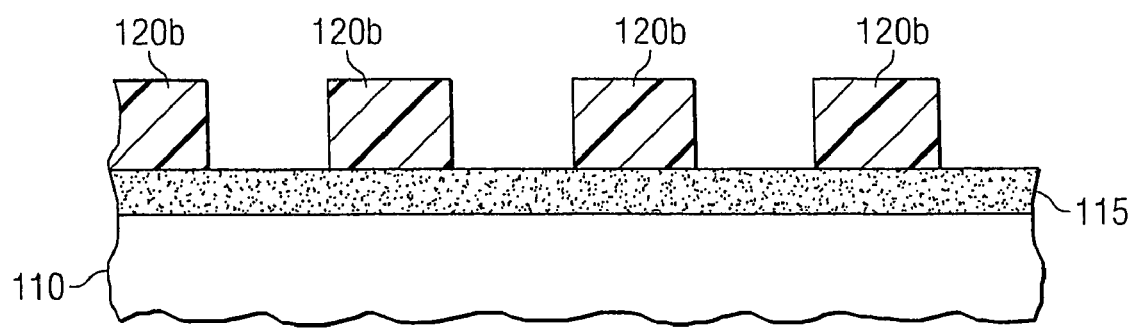

FIG. 4 illustrates the result of the spin off. Centrifugal force drives the developer (not illustrated) along with contaminating particles, thereby leaving a topcoat residue 125a behind. Turning now to FIG. 5, the topcoat reside 125a is dissolved in a suitable solution 140, preferably the topcoat remover 135 described above producing the structure shown in FIG. 6. The exposed resist 120a is next developed, thereby producing the substantially defect-free, patterned resist 120b of FIG. 7.

The first preferred embodiment of the invention described above is particularly advantageous when the topcoat is substantially insoluble in the developer, and the resist is substantially insoluble in the topcoat remover. In the second preferred embodiment discussed below, the topcoat layer is highly soluble in the developer; therefore, the developer dissolves the resist and the topcoat simultaneously.

The description of the second preferred embodiment commences by briefly referring back to FIG. 2. FIG. 2 comprises the substrate 110 underlying the BARC 115, underlying the exposed resist 120a, underlying the topcoat layer 125. FIG. 2 further comprises the impurity particle 130 contaminating topcoat 125, after forming the exposed resist 120a. In the second embodiment, as in the first, the impurity particle 130 did not shade any portion of the resist 120 during exposure.

Figure 8:
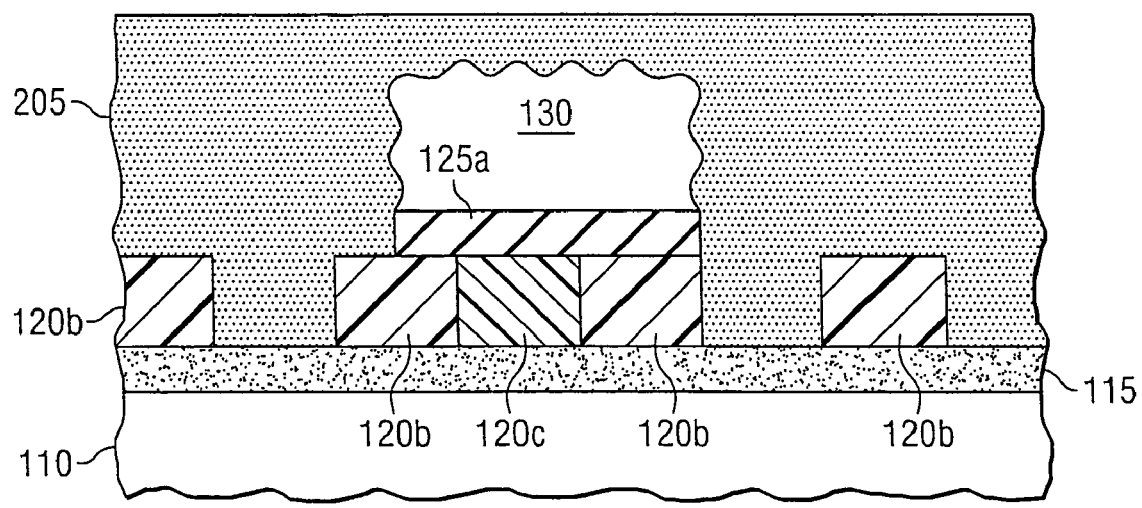
FIGS. 8-11 are side views illustrating particle removal and defect repair for a second embodiment of the invention.

Turning now to FIG. 8, there is illustrated the intermediate device after further processing according to a second preferred embodiment. As shown in FIG. 8, there is the patterned portion 120b of the photoresist, the topcoat residue 125a, and the impurity particle 130. In the second embodiment, a developer 205 dissolves both the topcoat and the resist simultaneously, thereby removing a first portion of the topcoat and forming the patterned resist 120b simultaneously.

As describe above, the impurity particle 130 acts as a barrier to dissolution of the topcoat, thereby causing the topcoat residue 125a to remain. In the embodiment illustrated in FIG. 8, however, the impurity particle 130 may also act as a barrier to dissolution of a second portion 120c of the resist, thereby leaving the second portion 120c behind as a residue.

Figure 9:
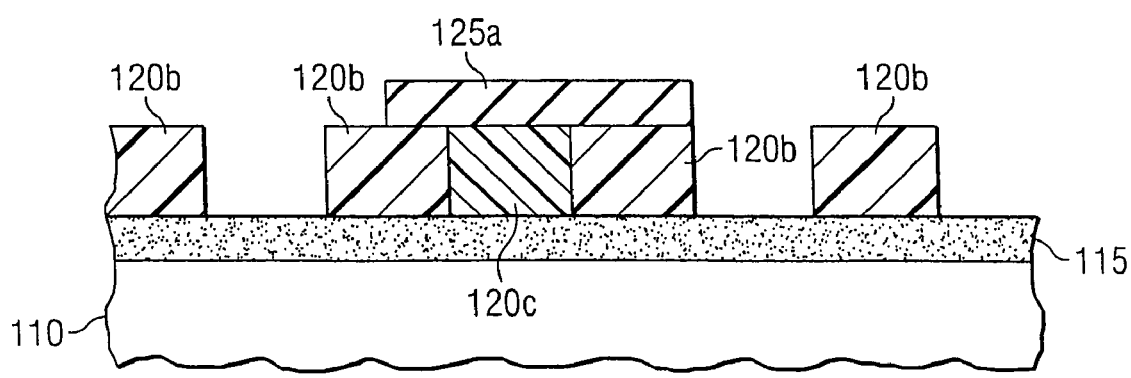
Figure 10:
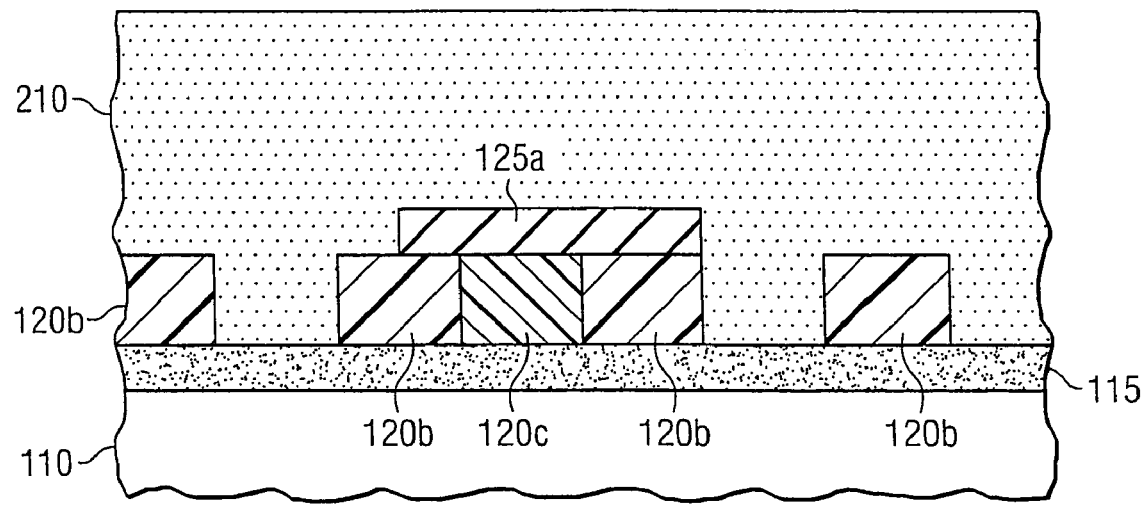
Figure 11:
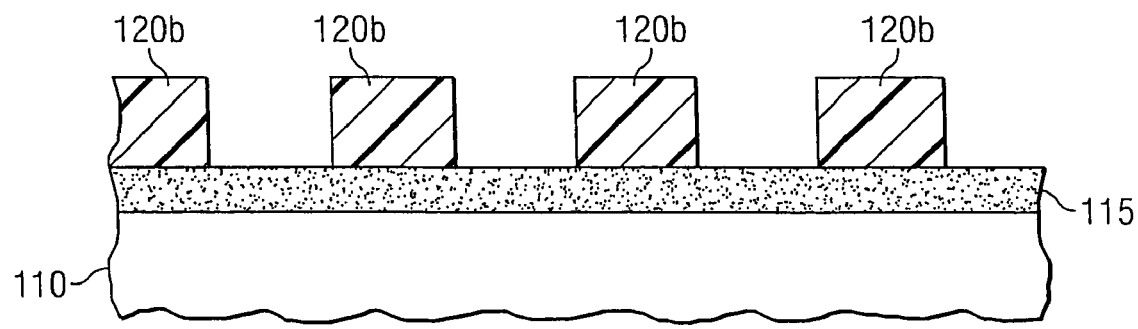

In the second embodiment, the impurity particle 130 is spun off as described above, thereby producing the intermediate device shown in FIG. 9, wherein the particle has been removed. Next, there follows a second developing step using a second developer 210, as illustrated in FIG. 10. Preferably, the second developer 210 is the same as the developer 205. Finally, after simultaneously dissolving both the topcoat residue 125a and the second portion 120c of the resist, there remains only the preferred patterned resist 120b, as shown in FIG. 11.

In embodiments of the invention, processing parameters may include angular acceleration, rotation velocity, clockwise/counterclockwise, rotation duration or period. In some embodiments the spin cleaning may include a series of steps. For example, a first step may include accelerating a wafer clockwise to a first rotational velocity. The next step may include maintaining the first rotational velocity for a first period. It may thereafter be accelerated to a second rotational velocity. In an embodiment of the invention, the second rotational velocity is opposite the first rotational velocity. The magnitudes of the first and second velocities may be the same or different. An embodiment for spinning on a resist using clockwise/counterclockwise rotations is described in co-pending and commonly assigned U.S. patent application Ser. No. 11/098,181, filed on Apr. 4, 2005, entitled "Method for Forming a Resist Film on a Substrate having Non-Uniform Topography," which application is hereby incorporated herein by reference.

The series of steps may be repeated a plurality of times. The series of steps may further include one or more periods of no rotation. For example, a series of steps may include a period of clockwise rotation, a period of no rotation, and a period of either clockwise or counterclockwise rotation. In other embodiments, a clockwise rotation step may proceed substantially instantaneously to a counterclockwise rotation, with no pause between rotations. Such impulsive changes in rotation may be useful in dislodging particles from recesses.

The duration of acceleration periods and constant rotation periods, may be up to several minutes, but preferably less than 60 seconds, and more preferably less than about 10 seconds.

Embodiments comprising a plurality of clockwise/counterclockwise rotations may be used when the surface of the wafer includes non-uniform topological features. Cleaning of non-uniform topologies is difficult with conventional methods because recesses in the surface trap particles thereby prevent their removal during cleaning. Such recesses may be up to about 10 μm deep and may include such features as trenches and vias.

After suitable removal of particulate contamination and completion of resist patterning, embodiments may further include effecting the substrate using the mask pattern, wherein effecting the substrate comprises etching a layer of the substrate. Thereafter, conventional methods may complete the semiconductor fabrication.

Although the present invention and its advantages have been described in detail, it should be understood that various changes, substitutions and alterations may be made herein without departing from the spirit and scope of the invention. For example, the embodiments described herein are equally suitable for front end of the line (FEOL) or back end of the line (BEOL) processing. They are suitable for wafers, intermediate devices, finished devices, and other substrates not generally used in semiconductor manufacturing.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A semiconductor fabrication method, the method comprising:
   forming a resist layer over a substrate and a topcoat layer over the resist layer;
   exposing the resist layer to a radiation transmitted through an immersion liquid;
   dissolving a first portion of the topcoat layer in a first topcoat remover solution, wherein a second portion of the topcoat layer under an impurity particle is not dissolved;
   spinning the substrate to remove the impurity particle and the dissolved first portion of the topcoat layer; and
   dissolving the second portion of the topcoat layer in a second topcoat remover solution wherein dissolving the second portion is performed after spinning the substrate to remove the impurity particle.

2. The method of claim 1, further comprising dispensing a cleaning liquid onto the resist layer before dissolving the first portion of the topcoat layer, and spinning off the cleaning liquid.

3. The method of claim 2, wherein the cleaning liquid comprises a material selected from the group consisting of water, acid, acetic acid, phosphorous acid, and combinations thereof.

4. The method of claim 1, further comprising dispensing a cleaning liquid onto the resist layer before exposing the resist layer, and spinning off the cleaning liquid.

5. The method of claim 1, wherein spinning the substrate comprises spinning the substrate about a rotational axis substantially perpendicular to a surface of the substrate at a rotational velocity up to about 3,000 rpm.

6. The method of claim 5, wherein the rotational velocity is maintained for less than about 10 seconds.

7. The method of claim 1, wherein the substrate comprises a partially fabricated integrated circuit on a semiconductor wafer.

8. The method of claim 1, wherein the resist layer comprises a photoresist.

9. The method of claim 1, wherein spinning the substrate comprises:
rotating the substrate in a first direction at a first rotational velocity; and
rotating the substrate in a second direction at a second rotational velocity, wherein the second direction is opposite the first direction.

10. The method of claim 9, wherein a magnitude of the first rotational velocity and a magnitude of the second rotational velocity are substantially equal.

11. The method of claim 9, further comprising:
maintaining the first rotational velocity for less than about 10 seconds; and
maintaining the second rotational velocity for less than about 10 seconds.

12. The method of claim 9, further comprising repeating rotating the substrate at the first rotational velocity and rotating the substrate at the second rotational velocity a plurality of times.

13. The method of claim 1, wherein the substrate comprises a material selected from the group consisting of Si, SiGe, GaAs, InP, GaN, silicon on insulator (SOI), and combinations thereof.

14. The method of claim 1, wherein the impurity particle comprises silicon oxide or a metal-containing impurity.

15. A semiconductor fabrication method, the method comprising:
forming a resist layer over a substrate and a topcoat layer on the resist layer;
exposing the resist layer to a radiation transmitted through an immersion liquid;
dissolving a first portion of the topcoat layer in a first topcoat remover, wherein the resist layer is substantially insoluble in the first topcoat remover;
spinning off the first topcoat remover, wherein the spinning off removes an impurity particle disposed over the resist layer along with the dissolved first portion, thereby exposing a second portion of the topcoat layer;
dissolving the second portion of the topcoat layer in a second topcoat remover, after spinning off the first topcoat remover, the first and the second topcoat removers comprising a similar composition; and
developing the resist layer using a developing solution, wherein the developing solution and the first and the second topcoat removers comprise a different composition.

16. The method of claim 15, further comprising dispensing a cleaning liquid onto the resist layer before exposing the resist layer and then spinning off the cleaning liquid.

17. The method of claim 16, wherein spinning off the cleaning liquid comprises rotating the substrate at up to about 3,000 rpm.

18. The method of claim 15, wherein the substrate comprises a partially fabricated integrated circuit on a semiconductor wafer.

19. The method of claim 15, wherein spinning off the first topcoat remover comprises a series of steps, the series of steps comprising:
rotating the substrate in a first direction at a first rotational velocity; and
rotating the substrate in a second direction at a second rotational velocity, wherein the second direction is opposite the first direction.

20. The method of claim 19, further comprising repeating the series of steps a plurality of times.

21. The method of claim 15, wherein the impurity particle comprises silicon oxide or a metal-containing impurity.

* * * * *